(12) United States Patent
Caffee et al.

(10) Patent No.: US 10,153,084 B2
(45) Date of Patent: Dec. 11, 2018

(54) PHYSICAL DESIGN IN MAGNETIC ENVIRONMENT

(71) Applicant: Silicon Laboratories Inc., Austin, TX (US)

(72) Inventors: Aaron J. Caffee, Scappoose, OR (US); Brian G. Drost, Corvallis, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/398,241

(22) Filed: Jan. 4, 2017

(65) Prior Publication Data
US 2018/0190424 A1 Jul. 5, 2018

(51) Int. Cl.
H01L 23/64 (2006.01)
H01F 27/34 (2006.01)
H01F 27/28 (2006.01)
H01F 41/04 (2006.01)
H01F 27/36 (2006.01)
H01L 23/50 (2006.01)
H01L 49/02 (2006.01)
H01L 23/552 (2006.01)
H01L 23/58 (2006.01)
H01L 23/66 (2006.01)

(52) U.S. Cl.
CPC ......... *H01F 27/34* (2013.01); *H01F 27/2804* (2013.01); *H01F 27/365* (2013.01); *H01F 41/041* (2013.01); *H01L 23/50* (2013.01); *H01L 23/552* (2013.01); *H01L 23/585* (2013.01); *H01L 23/645* (2013.01); *H01L 23/66* (2013.01); *H01L 28/10* (2013.01)

(58) Field of Classification Search
CPC ....... H01L 23/645; H01L 23/66; H01L 28/10; H01F 27/34; H01F 27/288; H01F 27/365
See application file for complete search history.

(56) References Cited

U.S. PATENT DOCUMENTS

| | | | |
|---|---|---|---|
| 7,141,883 B2 | 11/2006 | Wei et al. |
| 7,154,349 B2 | 12/2006 | Cabanillas |
| 7,236,024 B2 | 6/2007 | Huang et al. |
| 7,310,039 B1 | 12/2007 | Zhang |
| 7,375,411 B2 | 5/2008 | Zhang |
| 7,498,656 B2 | 3/2009 | Zhang et al. |
| 7,501,924 B2 | 3/2009 | Zhang |
| 8,344,841 B2 | 1/2013 | Gertenbach et al. |
| 8,576,039 B2 | 11/2013 | Yoon et al. |

(Continued)

OTHER PUBLICATIONS

Bunch, Ryan L. et al., "Quality Factor and Inductance in Differential IC Implementations," IEEE Microwave Magazine, Jun. 2002, 6 pages.

(Continued)

*Primary Examiner* — Phat X Cao
(74) *Attorney, Agent, or Firm* — Zagorin Cave LLP

(57) ABSTRACT

A technique for forming an integrated circuit including an inductor reduces magnetic coupling between the inductor and surrounding elements. The technique includes deliberate placement of circuit elements (e.g., terminals, pins, routing traces) in locations on the integrated circuit relative to a magnetic vector potential associated with the inductor and relative to a magnetic flux density field associated with the inductor to reduce or eliminate induced signals that degrade system performance.

20 Claims, 5 Drawing Sheets

(56) References Cited

U.S. PATENT DOCUMENTS

| | | | |
|---|---|---|---|
| 8,648,664 B2 | 2/2014 | Eldredge et al. | |
| 8,841,983 B2 | 9/2014 | Newton et al. | |
| 9,196,409 B2 | 11/2015 | Nazarian | |
| 9,473,150 B2 | 10/2016 | Caffee | |
| 9,543,068 B2* | 1/2017 | Aboush | H03L 7/099 |
| 2004/0222478 A1 | 11/2004 | Zhang et al. | |
| 2004/0222511 A1 | 11/2004 | Zhang | |
| 2006/0220778 A1* | 10/2006 | Marques | H01F 17/0006 336/225 |
| 2013/0141203 A1* | 6/2013 | Yoon | H01L 23/5227 336/170 |

OTHER PUBLICATIONS

Darabi, Hooman, "Radio Frequency Integrated Circuits and Systems," Cambridge University Press, May 2015, 8 pages.

Shahmohammadi, Mina, et al., "A 1/f Noise Upconversion Reduction Technique Applied to Class-D and Class-F Oscillators," IEEE International Solid-State Circuits Conference, 2015, pp. 444-445.

U.S. Appl. No. 14/722,607, filed May 27, 2015, entitled "Comb Terminals for Planar Integrated Circuit Inductor", naming Aaron J. Caffee as inventor.

U.S. Appl. No. 14/970,865, filed Dec. 16, 2015, entitled "Common-Mode Impedance Network for Reducing Sensitivity in Oscillators", naming Aaron J. Caffee as inventor.

Ruehli, A.E., "Inductance Calculations in a Complex Integrated Circuit Environment," IBM Journal of Research and Development, Sep. 1972, pp. 470-481.

* cited by examiner

PHYSICAL DESIGN IN MAGNETIC ENVIRONMENT

BACKGROUND

Field of the Invention

The present application relates to integrated circuits, and more particularly to integrated circuits that include inductor structures.

Description of the Related Art

In general, electronic oscillator circuits are used to generate repetitive oscillating electronic signals for a variety of integrated circuit applications (e.g., local oscillator signals for radio frequency mixers, transmitters for generating carrier waves for radio frequency signal transmission, etc.). Referring to FIG. 1, a clock generator circuit may use conventional tank circuit 100, which is a tuned circuit including inductor 104 coupled to capacitor 102. Charge flows back and forth from the plates of capacitor 102 through the inductor so the tuned circuit can store electrical energy oscillating at its resonant frequency. Amplifier circuit 108 compensates for small losses in conventional tank circuit 100 to sustain oscillation. By supplying a transconductance that is equal and opposite to the tank losses, amplifier circuit 108 can sustain oscillation indefinitely at the resonant frequency of conventional tank circuit 100 and at an amplitude determined by amplifier circuit 108.

When periodically driven, inductor 104 generates a time-varying magnetic vector potential and magnetic flux density fields (i.e., magnetic fields) that extend beyond the confines of the conductive loop. That magnetic energy may couple into neighboring circuitry. Some applications exploit this behavior in circuits, such as transformers. However, in other applications, (e.g., oscillator applications) this coupling is undesirable since it may induce unwanted voltages and/or currents within neighboring circuitry. Magnetic fields induced by neighboring circuitry can couple into circuitry including inductor 104 and degrade performance. That unwanted coupling can degrade overall system performance. Shielding on-chip circuitry from magnetic fields can be challenging when magnetic materials are not available. Therefore, techniques that address magnetic coupling are desired.

SUMMARY OF EMBODIMENTS OF THE INVENTION

In at least one embodiment, an integrated circuit includes an inductor having a first axis through a center of the inductor and a second axis through the center of the inductor. The first axis is a first nodal axis and includes a first location of a first magnetic node having a first negligible induced voltage amplitude at a distance from the center of the inductor. The second axis is a first anti-nodal axis and includes a second location of a first negligible magnetic flux density field and a first induced voltage amplitude greater than the first negligible induced voltage amplitude at the distance from the center of the inductor. The integrated circuit includes a first cluster of integrated circuit terminals concentrated about the first axis and distant from the second axis. The first negligible induced voltage amplitude may be a minimum induced voltage amplitude at the distance from the center of the inductor and the first induced voltage amplitude may be a maximum induced voltage amplitude at the distance from the center of the inductor. The integrated circuit may include an electrically conductive structure having an aperture at least as large as the inductor. The aperture may be centered about a projected surface of the inductor. The electrically conductive structure may be configured as an AC ground plane.

The integrated circuit may include a second cluster of integrated circuit terminals concentrated about the first axis and distant from the second axis. The first and second pluralities of integrated circuit terminals may be disposed at opposing ends of the inductor and equidistant from the second axis. The inductor may include at least four conductive loops and the inductor may have a third axis through the center of the inductor and a fourth axis through the center of the inductor. The third axis may be a second nodal axis and may include a third location of a second magnetic node having a second negligible induced voltage amplitude at the distance from the center of the inductor. The fourth axis may be a second anti-nodal axis. The fourth axis may include a fourth location of a second negligible magnetic flux density field and a second induced voltage amplitude greater than the second negligible induced voltage amplitude at the distance from the center of the inductor. The integrated circuit may include a second cluster of integrated circuit terminals concentrated about the third axis and distant from the second and fourth axes. The first cluster of terminals may be disposed at a first corner of an integrated circuit portion and the second plurality of terminals may be disposed at a second corner of the integrated circuit portion, opposite the first corner. The first cluster of terminals may include one or more power supply terminals configured to receive a high voltage level and the second cluster of terminals may include one or more power supply terminals configured to receive a low voltage level. The terminals may be integrated circuit bond pads and the inductor may be centered on an integrated circuit die.

In at least one embodiment, a method of manufacturing an integrated circuit includes forming an inductor having a first axis through a center of the inductor and a second axis through the center of the inductor. The first axis is a first nodal axis and includes a first location of a first magnetic node having a first negligible induced voltage amplitude at a distance from the center of the inductor. The second axis is a first anti-nodal axis, the second axis includes a second location of a first negligible magnetic flux density field and a first induced voltage amplitude at the distance from the center of the inductor greater than the first negligible induced voltage amplitude. The method includes forming a first cluster of integrated circuit terminals concentrated about the first axis and distant from the second axis.

The method may include forming an electrically conductive structure having an aperture at least as large as the inductor. The aperture may be centered about a projected surface of the inductor. The electrically conductive structure may be configured as an AC ground plane. The method may include forming a second cluster of integrated circuit terminals concentrated about the first axis and distant from the second axis. The first and second pluralities of integrated circuit terminals may be disposed at opposing ends of the inductor and equidistant from the second axis. The inductor may include at least four conductive loops and the inductor may have a third axis through the center of the inductor and a fourth axis through the center of the inductor. The third axis may be a second nodal axis. The third axis may include a third location of a second magnetic node having a second negligible induced voltage amplitude at the distance from the center of the inductor. The fourth axis may be a second anti-nodal axis. The fourth axis may include a fourth location of a second negligible magnetic flux density field and a second induced voltage amplitude at the distance from the center of the inductor greater than the second negligible induced voltage amplitude. The integrated circuit may further include a second cluster of integrated circuit terminals concentrated about the third axis and distant from the second and fourth axes. The first cluster of terminals may be formed at a first corner of an integrated circuit portion and the second plurality of terminals may be formed at a second corner of the integrated circuit portion, opposite the first corner. The first cluster of terminals may include one or more power supply terminals configured to receive a high voltage level and the second cluster of terminals may include one or more power supply terminals configured to receive a low voltage level. The method may include forming conductive traces parallel to the first axis.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique for forming an integrated circuit including an inductor reduces magnetic coupling between the inductor and surrounding elements. The technique includes deliberate placement of circuit elements (e.g., terminals, pins, routing traces) in locations on the integrated circuit relative to a magnetic vector potential field associated with the inductor and relative to a magnetic flux density field associated with the inductor to reduce or eliminate induced signals that degrade system performance.

Figure 1:
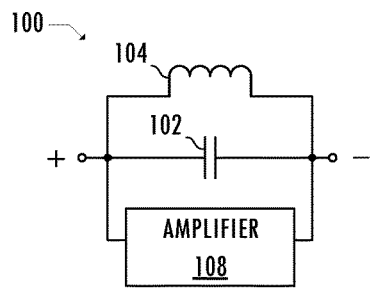
FIG. 1 illustrates a circuit diagram of a conventional LC oscillator circuit.
Figure 2:
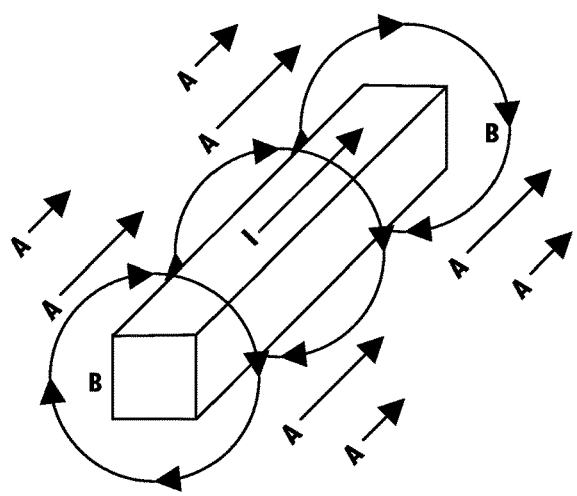
FIG. 2 illustrates magnetic flux density field contours and magnetic vector potential field lines for a conductor portion.
Figure 3:
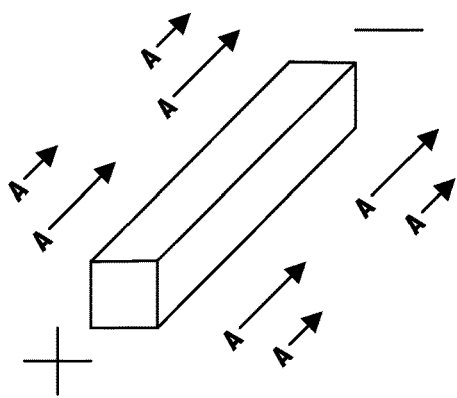
FIG. 3 illustrates an induced voltage associated with magnetic vector potential field lines for a conductor portion.

Referring to FIGS. 2 and 3, the current density field (J) supported by a conductor produces a magnetic vector potential field ($\vec{A}$). In general, the curl ($\vec{\nabla}\times$), of the magnetic vector potential field is the magnetic flux density field ($\vec{B}$):

$$\vec{\nabla}\times\vec{A}=\vec{B}.$$

The magnetic vector potential field may be computed by summing contributions of all current density components in the current density field:

$$\vec{A} = \frac{\mu}{4\pi}\iiint \frac{\vec{J}}{r}dxdydz.$$

The magnetic vector potential field has the same direction as nearby current flow (i.e., the magnetic vector potential field is in the same plane as the current flow). A time-varying magnetic vector potential field induces a voltage on a conductor in the same direction as the magnetic vector potential field:

$$-\frac{d(\vec{\nabla}\times\vec{A})}{dt} = -\frac{d\vec{B}}{dt} = \vec{\nabla}\times\vec{E};$$

$$-\frac{d\vec{A}}{dt} = \vec{E};$$

$$-\int \frac{d\vec{A}}{dt}\cdot d\vec{l} = \int \vec{E}\cdot d\vec{l} = \Delta V,$$

where $\vec{E}$ is the electric field induced by the current flow and $\vec{l}$ is the length of the conductor. In general, to reduce magnetic coupling between the inductor and nearby conductor traces, placement of conductive traces near and parallel to the inductor current should be reduced or avoided in favor of conductive traces extending orthogonally to a nearest inductor current, or where $$\overline{A_{tot}} = \Sigma \overline{A_j} \approx 0.$$

Figure 4:
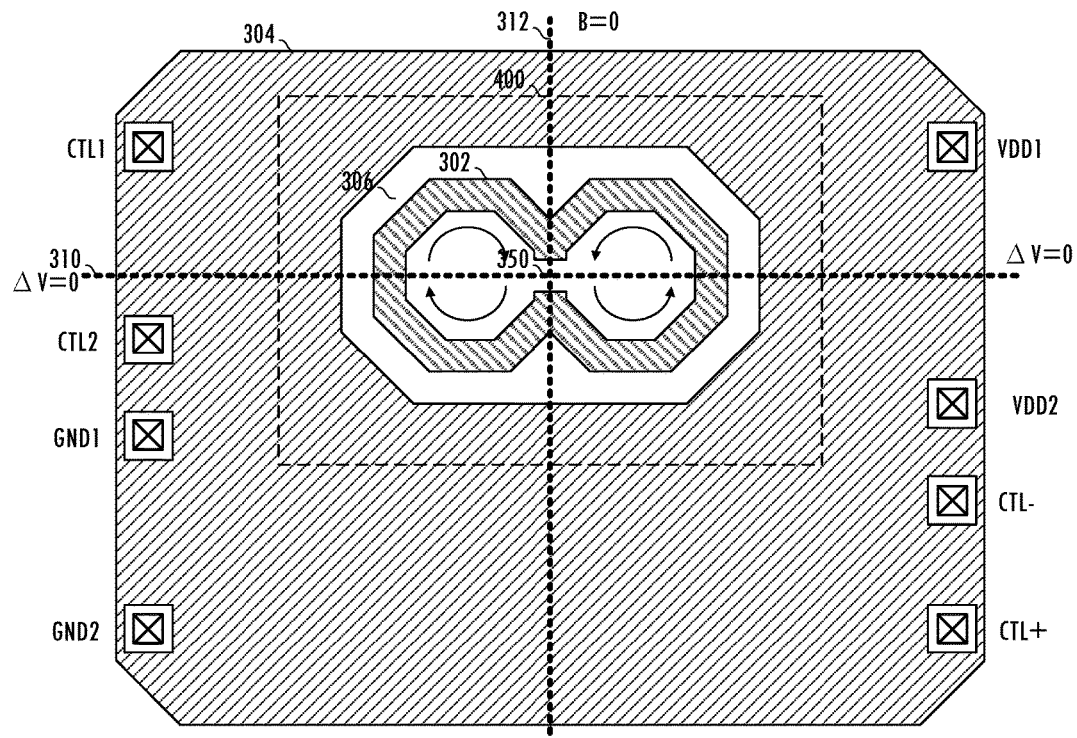
FIG. 4 illustrates an exemplary integrated circuit portion including a dual-loop inductor, an electromagnetic shielding structure, terminals, and axes associated with a magnetic vector potential field and a magnetic flux density field of the dual-loop inductor.

FIG. 4 illustrates a conventional dual-loop inductor formed on an integrated circuit die and exemplary terminals (e.g., CTL1, CTL2, GND1, GND2, VDD1, VDD2, CTL−, and CTL+) distributed around the inductor. The terminals may be ports coupled to other sections of the integrated circuit die or may be pads for coupling circuitry including the inductor to nodes external to the integrated circuit die. In general, conventional integrated circuit designs may evenly distribute bond pads around the die to facilitate ease of connection to off-chip elements and to reduce coupling between bond wires.

Inductor 302 may be surrounded by electrically conductive enclosure 304, which shields the inductor from on-die electromagnetic interference. Electrically conductive enclosure 304 may be a plate of a larger Faraday shield that provides shielding from external electromagnetic interference. In response to the magnetic flux density field generated by inductor 302, electrically conductive enclosure 304 generates a current (e.g., an eddy current) that may generate a magnetic flux density field that counteracts the inductor magnetic flux density field. That current consumes power that would otherwise be available to an associated integrated circuit and reduces the magnetic flux density field generated by inductor 302. Those two effects combined reduce the inductance and Q of an LC oscillator including the inductor. The current generated in electrically conductive enclosure 304 in response to inductor 302 may be further reduced, and a corresponding improvement to the Q of an LC oscillator including the inductor may be achieved, by including one or more apertures (e.g., aperture 306) in one or more plates of the Faraday cage.

In at least one embodiment, inductor 302 includes two planar loops formed from a conductive layer disposed above semiconductor substrate. In general, since inductance is a function of area, and equivalent series resistance tends to be a function of perimeter under low substrate-loss conditions (e.g., high substrate resistivity below the inductor), a loop-shaped conductor is used to implement the inductor to maximize the ratio of inductance to resistance. Although other inductor shapes may be used, the loop shape of the conductor results in the greatest area to perimeter ratio for inductor 302 and thus, maximizes Q of the inductor.

The planar conductive loops may be formed in a conductive layer that has low resistivity and may be a topmost metal layer in an integrated circuit manufacturing process. In at least one embodiment of inductor 302, the conductive layer is an ultra-thick layer formed above a semiconductor substrate. In general, an ultra-thick layer may include dielectric and conductive layers formed on an integrated circuit substrate below any passivation layer and below any integrated circuit bonding pads, if present. However, an ultra-thick layer may be formed on an integrated circuit die in the absence of a passivation layer or bonding pads. Ultra-thick layers typically have thicknesses substantially greater than the thicknesses of typical dielectric and conductive layers formed in lower layers of an integrated circuit stack. For example, a typical conductive layer of an integrated circuit is less than 1 µm thick. However, the inductor may be formed in an exemplary ultra-thick conductive layer that is at least 3 µm thick and corresponding dielectric layers may be at least 0.65 µm thick. Ultra-thick dielectric layers may include silicon nitride, oxynitride, silicon oxide, or other suitable materials. Ultra-thick conductive layers may include aluminum, copper, polysilicon, or other suitable conductive materials.

In at least one embodiment of an integrated circuit, an ultra-thick conductive layer is separated from traditional integrated circuit layers (e.g., typical conductor layers) by a transitional layer or layers that improve manufacturability. A transitional conductive layer has a thickness less than a thickness of the ultra-thick conductive layer, but greater than a thickness of a traditional conductive layer. Transitional layers may include a thick conductive layer and a thick dielectric layer and may be formed of any suitable material (e.g., silicon nitride, oxynitride, silicon oxide, aluminum, copper, polysilicon). A typical manufacturing technology uses few ultra-thick conductive layers and limits those layers to top metallization layers. A typical ultra-thick conductive layer is formed from a conductive material (e.g., 3 µm thick copper) that has a lower sheet resistance than the conductive material forming lower conductive layers (e.g., 1 µm thick transitional layer formed from aluminum). Note that embodiments of inductor 302 described herein are exemplary only and inductor structures consistent with techniques described herein are further described in U.S. patent application Ser. No. 13/250,455, filed on Sep. 30, 2011, entitled "Mutual Inductance Circuits," naming Adam B. Eldredge and Susumu Hara as inventors, now U.S. Pat. No. 8,648,664, which application is incorporated herein by reference.

In general, the current generated in electrically conductive enclosure 304 in response to the inductor may be further reduced and a corresponding improvement to the Q of an LC oscillator including the inductor may be achieved by including one or more apertures (e.g., aperture 306) in electrically conductive enclosure 304 (e.g., a top plate of a Faraday cage). Aperture 306 is substantially parallel to the current flow through inductor 302. In general, aperture 306 is larger than the inductor by an amount that may be based on the number of loops of the inductor, the inner loop radius, the outer loop radius, effective diameter between two opposing linear surfaces of the aperture, and/or other suitable parameters to ensure reasonably low eddy current losses, were the inductor projected into the same plane as the shield.

In general, the Q of the inductor increases with increases to aperture size. As the aperture size increases from the outer diameter of the inductor, inductor Q increases. However, an increase in the aperture size can expose surrounding on-die circuitry, causing substantial coupling between the surrounding on-die circuitry and the inductor. To reduce that coupling, on-die circuitry should remain underneath the electrically conductive enclosure 304 and outside the aperture. Therefore, any increase in the aperture size causes a corresponding increase in die area. Increases in aperture size beyond a certain size produce diminishing returns in improvements to Q and thus, a tradeoff exists between improvements to Q and an increase in die area, and, therefore, cost. Apertures having smaller diameters may be desirable in low cost applications having relaxed performance requirements. Apertures having greater diameters may be desirable in high performance applications where the increase in die cost is acceptable.

Figure 5:
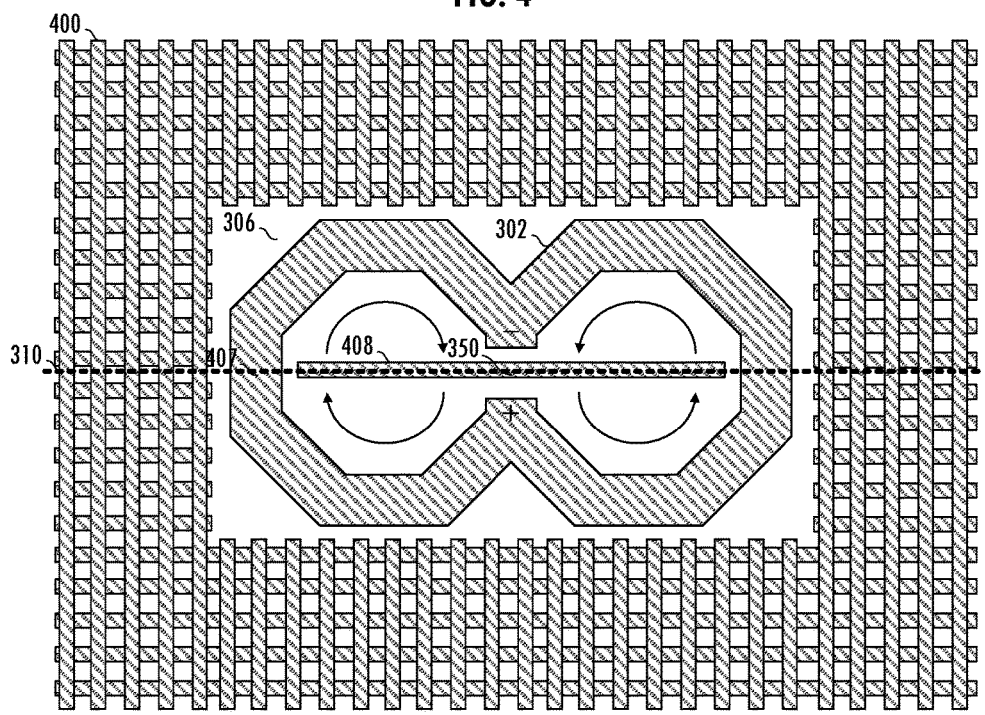
FIG. 5 illustrates a detailed portion of the exemplary integrated circuit portion of FIG. 4.

Although FIG. 4 illustrates aperture 306 as having eight linear sides in an exemplary process (e.g., a process that allows forming metal having dimensions of 45, 90, and 135 degree from a linear plane) an aperture having any suitable number of sides (e.g., four sides as illustrated in FIG. 5) or a circular aperture (i.e., no sides) may be used. In addition, an electromagnetic shielding structure may include multiple apertures, the individual apertures located in any suitable plate of an electromagnetic shielding structure.

The aperture may be formed in a top plate, a bottom plate or sidewall of the electrically conductive enclosure according to the need for improvement in Q. Electrically conductive enclosure 304 may be formed in any other traditional metal layer, an ultra-thick metal layer, a redistribution metal layer, other suitable materials, or any combination thereof. Referring to FIG. 5, in at least one embodiment, electrically conductive enclosure 304 is formed from two adjacent topmost conductive layers (e.g., Metal-7 and Metal-8) as illustrated by enlarged portion 400. However, the topmost conductive layer may be thicker and structures formed in the topmost conductive layer may have wider line widths than the penultimate conductive layer and structures formed in the penultimate conductive layer, respectively.

In at least one embodiment, inductor 302 may be directly or capacitively coupled (e.g., using inter-level interconnect coupled to center tap 407) to planar conductive structure 408. Planar conductive structure 408 extends from a point proximate to center tap 407 of inductor 302, along a nodal axis of inductor 302 to a point proximate to (e.g., between or otherwise equidistant to) the terminals of inductor 302. Accordingly, planar conductive structure 408 may at least partially bisect inductor 302. The symmetry of the planar conductive structure 408 with respect to inductor 302 reduces the effects of external voltage disturbances on the inductance of inductor 302, thereby reducing any quality factor degradation of the inductor due to inclusion of planar conductive structure 408 and may reduce the impact of aperture 306 in electrically conductive enclosure 304. Those techniques that reduce the effects of external voltage disturbances on an inductor are further described in U.S. patent application Ser. No. 14/970,865, filed on Dec. 16, 2015, entitled "Common-mode Impedance Network for Reducing Sensitivity in Oscillators," naming Aaron J. Caffee as inventor, which application is incorporated herein by reference.

Figure 6:
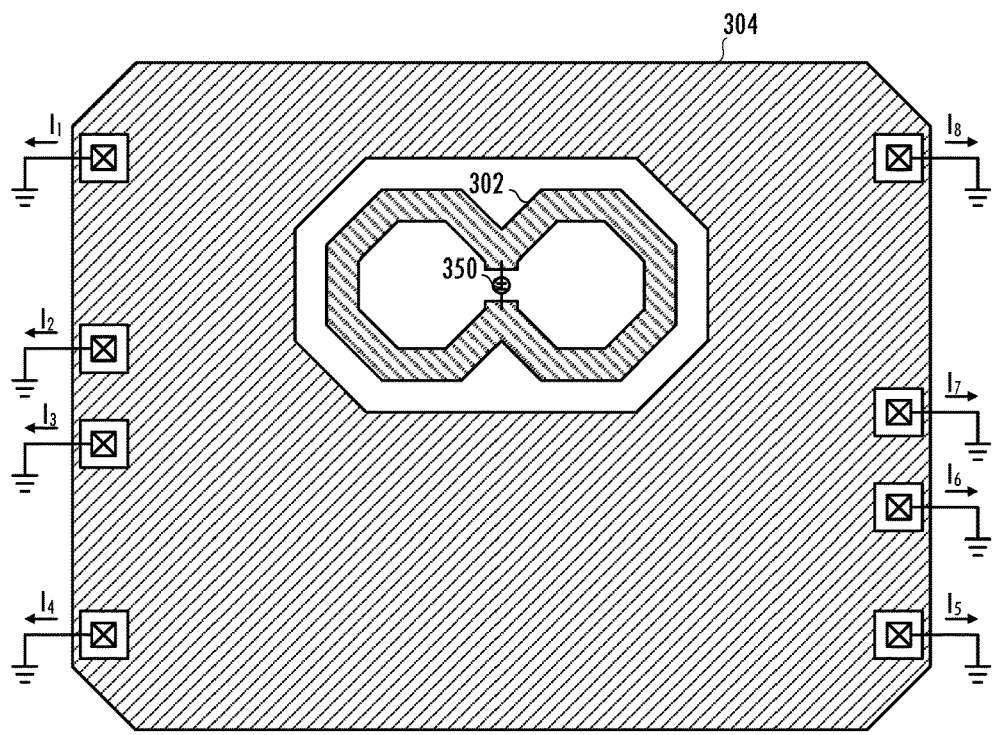
FIG. 6 illustrates exemplary induced currents of the integrated circuit portion of FIG. 4.

Referring to FIG. 4, inductor 302 is centered with respect to left and right edges of electrically conductive enclosure 304, but closer to the top edge of the electrically conductive enclosure 304, which may be the edge of an integrated circuit die. No terminals are coincident with axis 312, which corresponds to a location where the magnetic flux density field is zero. Conventional spacing of the terminals around the inductor results in no terminals coincident with axis 310. Axis 310 corresponds to a path in which the symmetric time-varying current density field contained within inductor 302 when periodically driven generates a symmetric time varying magnetic vector potential field with negligible or no component along the axis. Therefore, negligible or no induced voltage amplitude occurs along the axis as measured relative to center 350 of inductor 302. Since the terminals are spaced in regions offset from axis 301, a residual magnetic vector potential field exists within this space, causing an induced voltage amplitude between the terminals and axis 310. Those induced voltage amplitudes can cause current flow through the terminals (e.g., $I_1$, $I_2$, $I_3$, ..., $I_8$), according to impedances of the terminals. Referring to FIG. 6, for example, when the inductor is periodically driven differentially, the terminals will have non-zero induced voltage amplitudes that cause alternating current to flow through the terminals. Alternating current driven through the terminals by surrounding circuits can induce currents within the circuit including the inductor. That coupling between the LC oscillator (or other circuit) including the inductor and the surrounding terminals can cause undesirable effects, e.g., frequency pulling of an LC oscillator due to unwanted loading by terminal couplings and associated terminal impedances, or signal integrity issues at the terminals caused by the LC oscillator.

Figure 7:
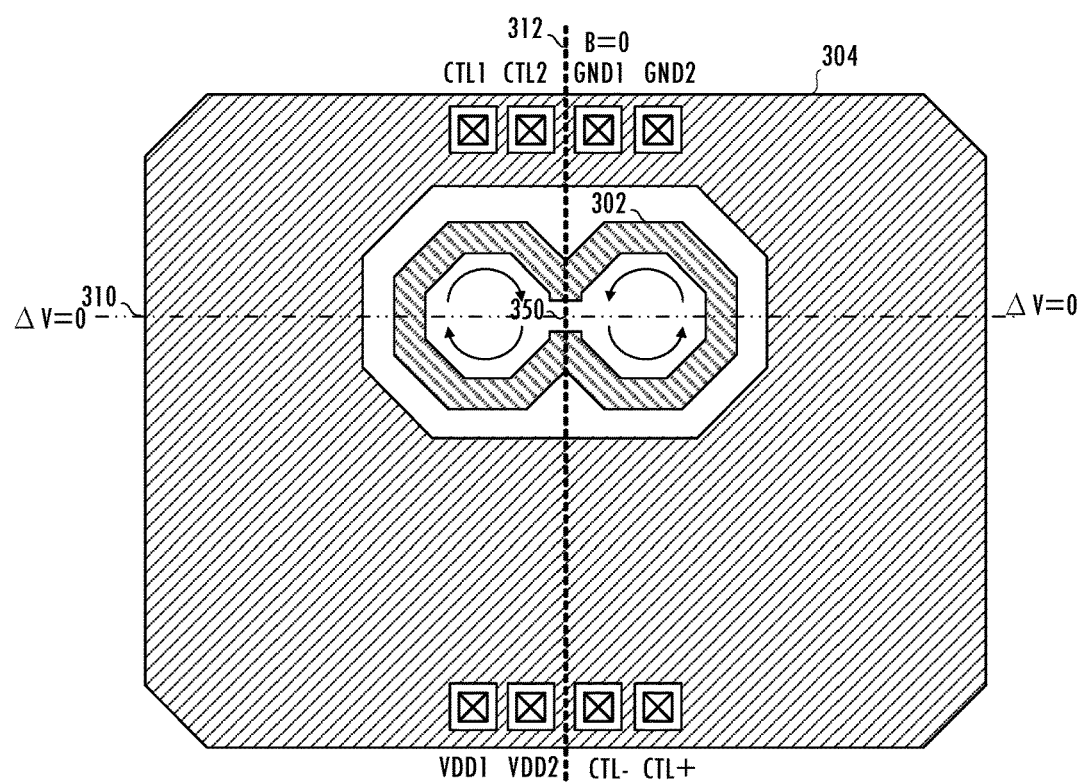
FIG. 7 illustrates exemplary terminal placements for the integrated circuit portion of FIG. 4.

Referring to FIG. 7, placement of the terminals centered around axis 312 along a broadside of the two-loop inductor reduces or eliminates the time-varying magnetic flux density field through local loops formed about axis 312, but increases or maximizes the induced voltage amplitudes seen at the terminals since it is an anti-nodal axis and, therefore, a location of substantial or maximum induced voltage amplitude as measured relative to the voltage level at the center 350 of inductor 302 at a given distance from the center 350 of inductor 302. As referred to herein, an induced voltage amplitude is considered nodal with respect to an axis in its plane if the induced voltage amplitude along the axis is not time-varying. As referred to herein, an induced voltage amplitude is considered anti-nodal if the induced voltage amplitude at a particular distance along the axis represents a substantial or maximum voltage amplitude at the particular radial distance from center 350 of inductor 302. Placement of terminals proximate to axis 312 or axis 310 trades off a location of magnetic flux density field cancellation and a location of induced voltage amplitude attenuation or cancellation.

Figure 8:
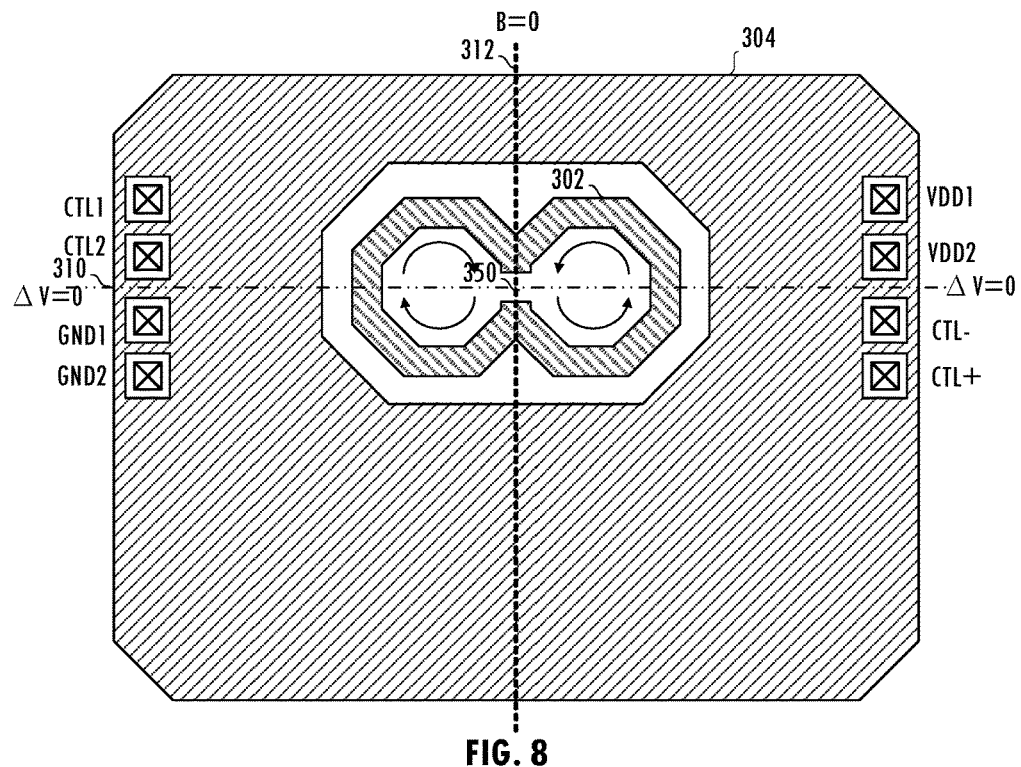
FIG. 8 illustrates exemplary terminal placements for the integrated circuit portion of FIG. 4 consistent with at least one embodiment of the invention.

Rather than positioning the terminals centered on or about an axis that corresponds to a location where the magnetic flux density field is zero, the terminals may be positioned at magnetic nodes associated with the inductor, i.e., concentrated on or about an axis where the voltage amplitude induced by the inductor is zero, as illustrated in FIG. 8. Symmetry cancels the induced magnetic flux density field through terminal conductor loops or bond wire loops formed between terminals on opposite sides of the inductor, thereby reducing or eliminating induced parasitic current in those global loops as compared to inductor systems that include the terminals at locations distant from the magnetic node. The terminals are positioned as close as practicable to the magnetic nodes, thereby forming a cluster of terminals about the magnetic node while reducing or minimizing the magnetic flux density experienced in local loops formed between adjacent terminals on the same side of the inductor. In pad-limited integrated circuits, terminals that are more sensitive to induced voltage amplitudes (e.g., radio frequency signals or power supply signals) may be located on or near the magnetic node while other, less sensitive terminals may be located farther away.

Figure 9:
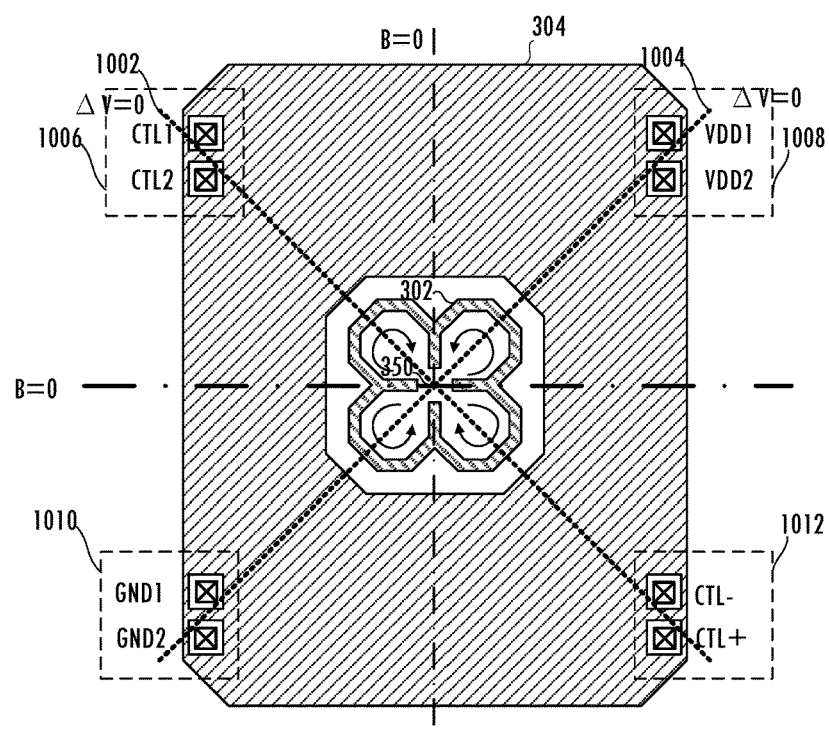
FIG. 9 illustrates exemplary terminal placements for the integrated circuit portion including a four-loop inductor and an electromagnetic shielding structure consistent with at least one embodiment of the invention.

Additional techniques may reduce local current loops that may be caused by interaction of the inductor with elements in the environment. For example, effects of local current loops may be reduced by increasing inductor loop count. An increased number of loops is associated with an increased number of magnetic nodes. For example, by increasing the number of conductive loops from two conductive loops, as illustrated in FIG. 8 to four conductive loops, as illustrated in FIG. 9, the number of nodal axes doubles (e.g., nodal axes 1002 and 1004) and the number of magnetic nodes at the periphery of the integrated circuit portion also doubles. Terminal clusters 1006, 1008, 1010, and 1012 include terminals may be concentrated on or about nodal axes 1002 and 1004. In addition, the increased number of loops reduces interaction of the magnetic flux density field of the inductor with the conductive plate and integrated circuit power grid. While only two terminals may be placed at the periphery of the integrated circuit portion on the magnetic nodes associated with the inductor and only four terminals may be placed at the periphery of the integrated circuit portion adjacent to the magnetic nodes associated with the inductor of FIG. 8, the embodiment of FIG. 9 may have up to four terminals placed at the periphery of the integrated circuit portion on magnetic nodes associated with the inductor and up to eight terminals may be placed adjacent to magnetic nodes associated with the inductor, although additional terminals may be centered about the magnetic nodes at the periphery of the integrated circuit portion. In some embodiments, terminals need not be located at the periphery of the integrated circuit, and additional terminals may be located on or adjacent to an axis corresponding to a magnetic node associated with the inductor. In addition, signals routed in conductive traces in proximity to the inductor may be routed parallel to the first axis to reduce or eliminate induced currents in those conductive traces.

Figure 10:
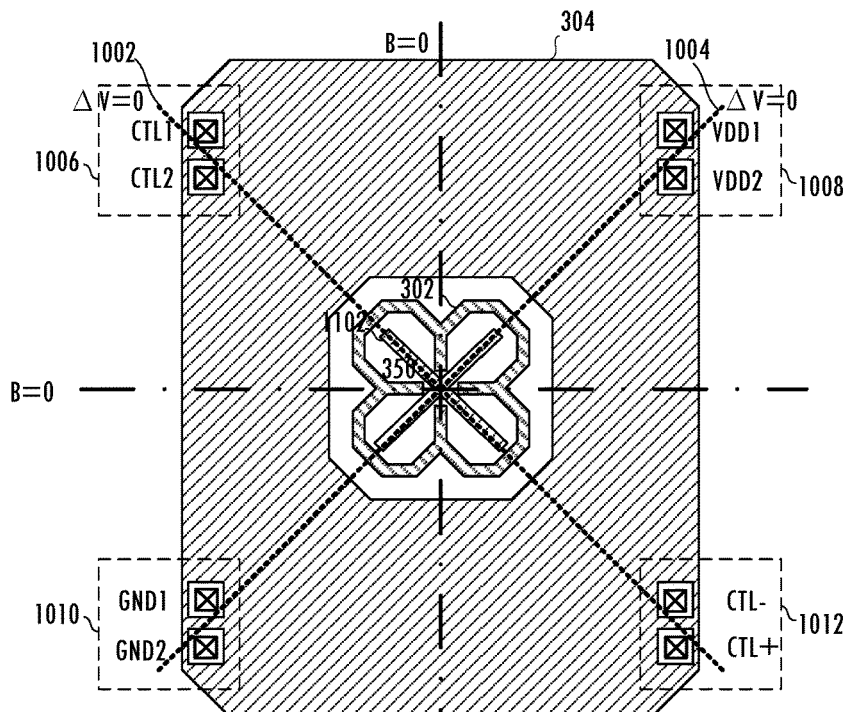
FIG. 10 illustrates an AC grounding structure, an electromagnetic shielding structure, and exemplary terminal placements for the integrated circuit portion including a four-loop inductor consistent with at least one embodiment of the invention.

Referring to FIG. 10, routing an AC ground along the magnetic node results in a connection to the ground plane with negligible induced voltage amplitude. In addition, by routing signals along the AC ground plane, return current paths may have minimal loop area and, therefore, significantly less unwanted induced electromagnetic signals. Combination of those techniques with locating terminals at or near the magnetic nodes, as described above further limits the amount of current that is induced off chip through terminal conductors. Note that, in the embodiment of FIG. 10, the two nodal axes (e.g., nodal axis 1002 and nodal axis 1004) where routing along these axes generates no induced voltage amplitude and the ground plane that has a direct path to each terminal cause each pad to be located at a point within the magnetic flux density field where only a negligible differential voltage will not exist across any two pads. Accordingly, reduced coupling exists between the inductor and the terminals and less or no induced current will escape through the terminals decreasing sensitivity of the inductor to external loops formed via the bond wires, board routes, etc. Thus, techniques that reduce generation of spurs and/or frequency pulling of an LC-VCO, from the surrounding environment have been disclosed. The techniques improve magnetic isolation of a design, which may improve system performance, e.g. spur performance, frequency stability, etc.

Figure 11:
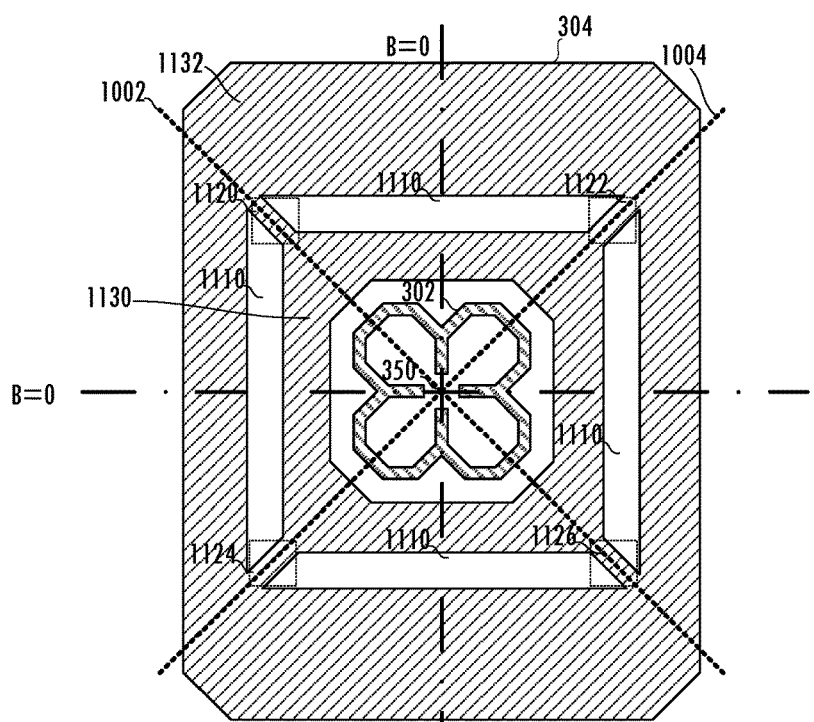
FIG. 11 illustrates exemplary terminal placements for terminals integrated with an electromagnetic shielding structure consistent with at least one embodiment of the invention.

Referring to FIG. 11, in at least one embodiment of an integrated circuit including an inductor, electrically conductive enclosure 304 includes additional apertures 1110 that partition electrically conductive enclosure 304 into an inner portion 1130 and an outer portion 1132 that are connected by metallization (which may be referred to herein as terminal locations of the electrically conductive AC ground of the inductor) on or about the nodal axes 1002 and 1004. In some embodiments, each aperture is disposed the same distance from center 350 of inductor 302. Thus, inner portion 1130 and outer portion 1132 are connected by terminals 1120, 1122, 1124, and 1126 at locations that have negligible or zero induced voltage amplitudes, thus increasing isolation between inductor 302 and the surrounding system. Although apertures 1110 may have other shapes and may be included in different numbers to form a suitable number of terminals at locations having negligible or zero induced voltage amplitudes different inductor systems.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein. In addition, the computer-readable media may store instructions as well as data that can be used to implement the invention. The instructions/data may be related to hardware, software, firmware or combinations thereof.

Thus, various embodiments of a technique for forming an integrated circuit system including an inductor have been described. The description of the invention set forth herein is illustrative, and is not intended to limit the scope of the invention as set forth in the following claims. For example, while the invention has been described in embodiments in which an inductor includes particular numbers of loops coupled in parallel, one of skill in the art will appreciate that the teachings herein can be utilized with other numbers of loops and multi-loop inductors including loops coupled in series. In addition, although the inductors are described with reference to a tank circuit of an oscillator, one of skill in the art will appreciate that the teachings herein can be utilized with inductors used in other applications (e.g., filter or power amplification applications). Variations and modifications of the embodiments disclosed herein, may be made based on the description set forth herein, without departing from the scope and spirit of the invention as set forth in the following claims.

What is claimed is:

1. An integrated circuit comprising:
    an inductor having a first axis through a center of the inductor and a second axis through a center of the inductor, the first axis being a first nodal axis, the first axis including a first location of a first magnetic node having a first negligible induced voltage amplitude at a distance from the center of the inductor and the second axis being a first anti-nodal axis, the second axis including a second location of a first negligible magnetic flux density field and a first induced voltage amplitude at the distance from the center of the inductor greater than the first negligible induced voltage amplitude; and
    a first cluster of integrated circuit terminals concentrated about the first axis and distant from the second axis.

2. The integrated circuit, as recited in claim 1, wherein the first negligible induced voltage amplitude is a minimum induced voltage amplitude at the distance from the center of the inductor and the first induced voltage amplitude is a maximum induced voltage amplitude at the distance from the center of the inductor.

3. The integrated circuit, as recited in claim 1, further comprising:
    an electrically conductive structure having an aperture at least as large as the inductor, the aperture being centered about a projected surface of the inductor, the electrically conductive structure being configured as an AC ground plane.

4. The integrated circuit, as recited in claim 1, further comprising:
    a second cluster of integrated circuit terminals concentrated about the first axis and distant from the second axis, the first cluster of integrated circuit terminals and the second cluster of integrated circuit terminals being disposed at opposing ends of the inductor and equidistant from the second axis.

5. The integrated circuit, as recited in claim 3, wherein the aperture is substantially parallel to a plane of current flow in the inductor.

6. The integrated circuit, as recited in claim 3, wherein the electrically conductive structure comprises:
    alternating conductive lines coupled to different voltage potentials, the alternating conductive lines forming an electromagnetic shielding structure.

7. The integrated circuit, as recited in claim 1, wherein the inductor comprises at least four conductive loops and the inductor has a third axis through the center of the inductor and a fourth axis through the center of the inductor, the third axis being a second nodal axis, the third axis including a third location of a second magnetic node having a second negligible induced voltage amplitude at the distance from the center of the inductor and the fourth axis being a second anti-nodal axis, the fourth axis including a fourth location of a second negligible magnetic flux density field and a second induced voltage amplitude greater than the second negligible induced voltage amplitude at the distance from the center of the inductor, and the integrated circuit further comprises a second cluster of integrated circuit terminals concentrated about the third axis and distant from the second and fourth axes.

8. The integrated circuit, as recited in claim 4, wherein the first cluster of integrated circuit terminals is disposed at a first corner of an integrated circuit portion and the second cluster of integrated circuit terminals is disposed at a second corner of the integrated circuit portion, opposite the first corner and the first cluster of integrated circuit terminals includes one or more power supply terminals configured to receive a high voltage level and the second cluster of integrated circuit terminals includes one or more power supply terminals configured to receive a low voltage level.

9. The integrated circuit, as recited in claim 1, wherein the integrated circuit terminals are integrated circuit bond pads and the inductor is centered on an integrated circuit die.

10. The integrated circuit, as recited in claim 1, further comprising:
conductive traces routed parallel to the first axis.

11. The integrated circuit, as recited in claim 1, wherein the first cluster of integrated circuit terminals includes at least one terminal associated with a radio frequency signal.

12. A method of manufacturing an integrated circuit comprising:
forming an inductor having a first axis through a center of the inductor and a second axis through a center of the inductor, the first axis being a first nodal axis, the first axis including a first location of a first magnetic node having a first negligible induced voltage amplitude at a distance from the center of the inductor and the second axis being a first anti-nodal axis, the second axis including a second location of a first negligible magnetic flux density field and a first induced voltage amplitude at the distance from the center of the inductor greater than the first negligible induced voltage amplitude; and
forming a first cluster of integrated circuit terminals concentrated about the first axis and distant from the second axis.

13. The method of manufacturing an integrated circuit, as recited in claim 12, wherein the first negligible induced voltage amplitude is a minimum induced voltage amplitude at the distance from the center of the inductor and the first induced voltage amplitude is a maximum induced voltage amplitude at the distance from the center of the inductor.

14. The method of manufacturing an integrated circuit, as recited in claim 12, further comprising:
forming an electrically conductive structure having an aperture at least as large as the inductor, the aperture being centered about a projected surface of the inductor, the electrically conductive structure being configured as an AC ground plane.

15. The method of manufacturing an integrated circuit, as recited in claim 12, further comprising:
forming a second cluster of integrated circuit terminals concentrated about the first axis and distant from the second axis, the first cluster of integrated circuit terminals and the second cluster of integrated circuit terminals being disposed at opposing ends of the inductor and equidistant from the second axis.

16. The method of manufacturing an integrated circuit, as recited in claim 12, wherein the inductor comprises at least four conductive loops and the inductor has a third axis through the center of the inductor and a fourth axis through the center of the inductor, the third axis being a second nodal axis, the third axis including a third location of a second magnetic node having a second negligible induced voltage amplitude at the distance from the center of the inductor and the fourth axis being a second anti-nodal axis, the fourth axis including a fourth location of a second negligible magnetic flux density field and a second induced voltage amplitude at the distance from the center of the inductor greater than the second negligible induced voltage amplitude, and the integrated circuit further comprises a second cluster of integrated circuit terminals concentrated about the third axis and distant from the second and fourth axes.

17. The method of manufacturing an integrated circuit, as recited in claim 15, wherein the first cluster of integrated circuit terminals is formed at a first corner of an integrated circuit portion and the second cluster of integrated circuit terminals is formed at a second corner of the integrated circuit portion, opposite the first corner and the first cluster of integrated circuit terminals includes one or more power supply terminals configured to receive a high voltage level and the second cluster of integrated circuit terminals includes one or more power supply terminals configured to receive a low voltage level.

18. The method of manufacturing an integrated circuit, as recited in claim 12, further comprising forming conductive traces routed parallel to the first axis.

19. The integrated circuit manufactured by the method of claim 12.

20. An apparatus comprising:
means for generating an inductance on an integrated circuit, the means for generating an inductance having a first axis through a center of the means for generating and a second axis through the center of the means for generating, the first axis being a first nodal axis, the first axis including a location of a magnetic node having a first negligible induced voltage amplitude and the second axis being a first anti-nodal axis, the second axis including a second location of a first negligible magnetic flux density field and a first induced voltage amplitude at a distance from the center of the means for generating an inductance greater than the first negligible induced voltage amplitude; and
means for coupling signals to the integrated circuit, the means for coupling being concentrated about the first axis and distant from the second axis.

* * * * *

UNITED STATES PATENT AND TRADEMARK OFFICE
CERTIFICATE OF CORRECTION

PATENT NO. : 10,153,084 B2
APPLICATION NO. : 15/398241
DATED : December 11, 2018
INVENTOR(S) : Aaron J. Caffee and Brian G. Drost Page 1 of 1

It is certified that error appears in the above-identified patent and that said Letters Patent is hereby corrected as shown below:

In the Claims

In Column 10, Line 63, please replace "second and fourth" with --second axis and the fourth--;
In Column 10, Line 64, please replace "axes" with --axis--;
In Column 11, Line 8, please replace "wherein the" with --wherein--;
In Column 11, Line 9, please insert --of the first cluster of integrated circuit terminals-- after "terminals".

Signed and Sealed this
Twenty-sixth Day of February, 2019

Andrei Iancu
*Director of the United States Patent and Trademark Office*